United States Patent
Himmelmann et al.

(10) Patent No.: US 9,398,721 B2
(45) Date of Patent: Jul. 19, 2016

(54) COOLING FLUID FLOW PASSAGE MATRIX FOR ELECTRONICS COOLING

(71) Applicant: Hamilton Sundstrand Corporation, Charlotte, NC (US)

(72) Inventors: Richard A. Himmelmann, Beloit, WI (US); Joseph Turney, Amston, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 286 days.

(21) Appl. No.: 13/950,555

(22) Filed: Jul. 25, 2013

(65) Prior Publication Data

US 2015/0029665 A1    Jan. 29, 2015

(51) Int. Cl.
*H05K 7/20* (2006.01)
*H01L 23/473* (2006.01)

(52) U.S. Cl.
CPC .......... *H05K 7/20218* (2013.01); *H01L 23/473* (2013.01); *H01L 23/4735* (2013.01); *H01L 2924/0002* (2013.01)

(58) Field of Classification Search
CPC ........... H05K 7/20218; H01L 23/4735; H01L 23/473; H01L 2924/0002; H01L 23/42; H01L 23/44; H01L 23/46
USPC ............ 361/689, 699, 679.54, 704, 717, 718, 361/719
See application file for complete search history.

(56) References Cited

U.S. PATENT DOCUMENTS

| | | | |
|---|---|---|---|
| 5,016,707 A * | 5/1991 | Nguyen | F28F 3/086 165/165 |
| 5,768,103 A | 6/1998 | Kobrinetz et al. | |
| 7,183,133 B2 | 2/2007 | Lindgren et al. | |
| 7,535,099 B2 | 5/2009 | Suh et al. | |
| 7,592,697 B2 | 9/2009 | Arana et al. | |
| 7,929,305 B1 | 4/2011 | Pal | |
| 8,291,966 B2 | 10/2012 | Lindgren et al. | |
| 8,331,091 B2 | 12/2012 | Kaslusky et al. | |
| 8,333,210 B1 | 12/2012 | Henkel et al. | |
| 8,427,108 B2 | 4/2013 | Swenson et al. | |
| 8,461,588 B2 | 6/2013 | Schnetker | |
| 2004/0206477 A1 | 10/2004 | Kenny et al. | |
| 2007/0119565 A1 | 5/2007 | Brunschwiler et al. | |
| 2007/0272392 A1 | 11/2007 | Ghosh et al. | |
| 2008/0264604 A1 | 10/2008 | Campbell et al. | |
| 2009/0283244 A1 | 11/2009 | Bezama et al. | |
| 2010/0157526 A1 * | 6/2010 | Beaupre | H01L 23/473 361/689 |
| 2010/0326627 A1 | 12/2010 | Schon | |
| 2012/0012299 A1 * | 1/2012 | Avery | G05D 7/0694 165/287 |

OTHER PUBLICATIONS

European Search Report for European Application No. 14177118.8 mailed May 6, 2015.

* cited by examiner

Primary Examiner — Jerry Wu
Assistant Examiner — Stephen Sul
(74) Attorney, Agent, or Firm — Carlson, Gaskey & Olds, PC

(57) ABSTRACT

A cooling supply package for an electronic component has a supply port communicating with a plurality of outer supply channels, and a return port communicating with a plurality of outer return channels. The outer supply channels and outer return channels communicate with distinct ones of openings in a slot layer and into return and supply slots, respectively. An orifice layer supplies fluid to an electronic component from supply slots and receives return fluid into the return slots after having cooled the electronic component. A cooling supply and electronic combination is also disclosed.

19 Claims, 10 Drawing Sheets

COOLING FLUID FLOW PASSAGE MATRIX FOR ELECTRONICS COOLING

BACKGROUND

This application relates to cooling passages that will deliver and then return cooling fluid for an electronic component.

Electronics are becoming utilized in more and more applications. The size of electronic components is continuously being reduced. There are now any number of electronic chips that are on the order of one millimeter by one millimeter, or even smaller.

As the applications controlled and performed by the electronic components have increased, the heat generated by the electronic components has also increased. The historic ways of dissipating heat, such as heat fins, may no longer always be adequate.

Thus, it becomes important to provide cooling fluid in an efficient manner to the very small electronic components.

However, given the extremely small sizes involved, the formation of the required passages to supply cooling fluid is challenging. Further, supplying fluid, and then returning fluid in an efficient manner, and with control over the pressure losses, and other flow characteristics, has proven challenging.

SUMMARY

A cooling supply package for an electronic component has a supply port communicating with a plurality of outer supply channels, and a return port communicating with a plurality of outer return channels. The outer supply channels and outer return channels communicate with distinct ones of openings in a slot layer and into return and supply slots, respectively. An orifice layer supplies fluid to an electronic component to be cooled from supply slots and receives return fluid into the return slots after having cooled the electronic component. A cooling supply and electronic component combination is also disclosed.

These and other features may be best understood from the following drawings and specification.

DETAILED DESCRIPTION

Figure 1:
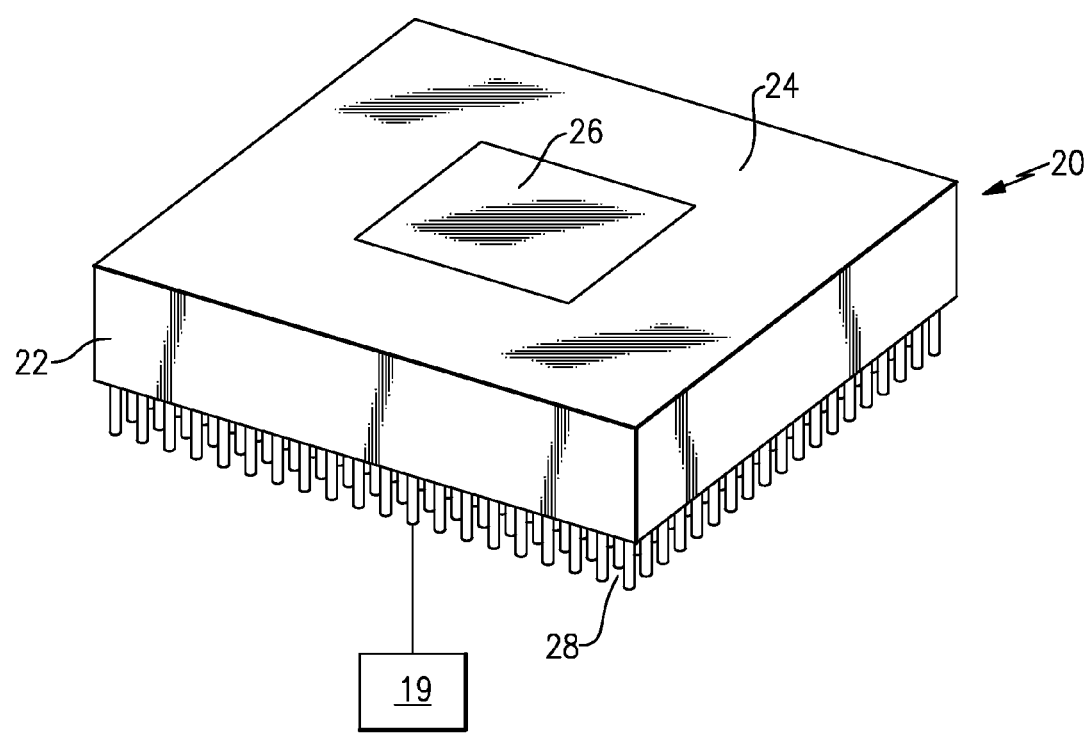
FIG. 1 shows an electronic component.

FIG. 1 shows a electronic assembly 20 that includes an electronic component 22, such as a silicon chip or any other electronic component. Such components may be on the order of one millimeter by one millimeter, or even smaller. However, no size limitation should be taken as being implied by this example. Component 22 is shown communicating, as known, with a schematically shown system 19 through pins 28.

Electronic component 22 is the electronic portion itself. Electronic component 22 has a zone 24 and a zone 26 that may generate more heat than zone 24, in one example.

Figure 2:
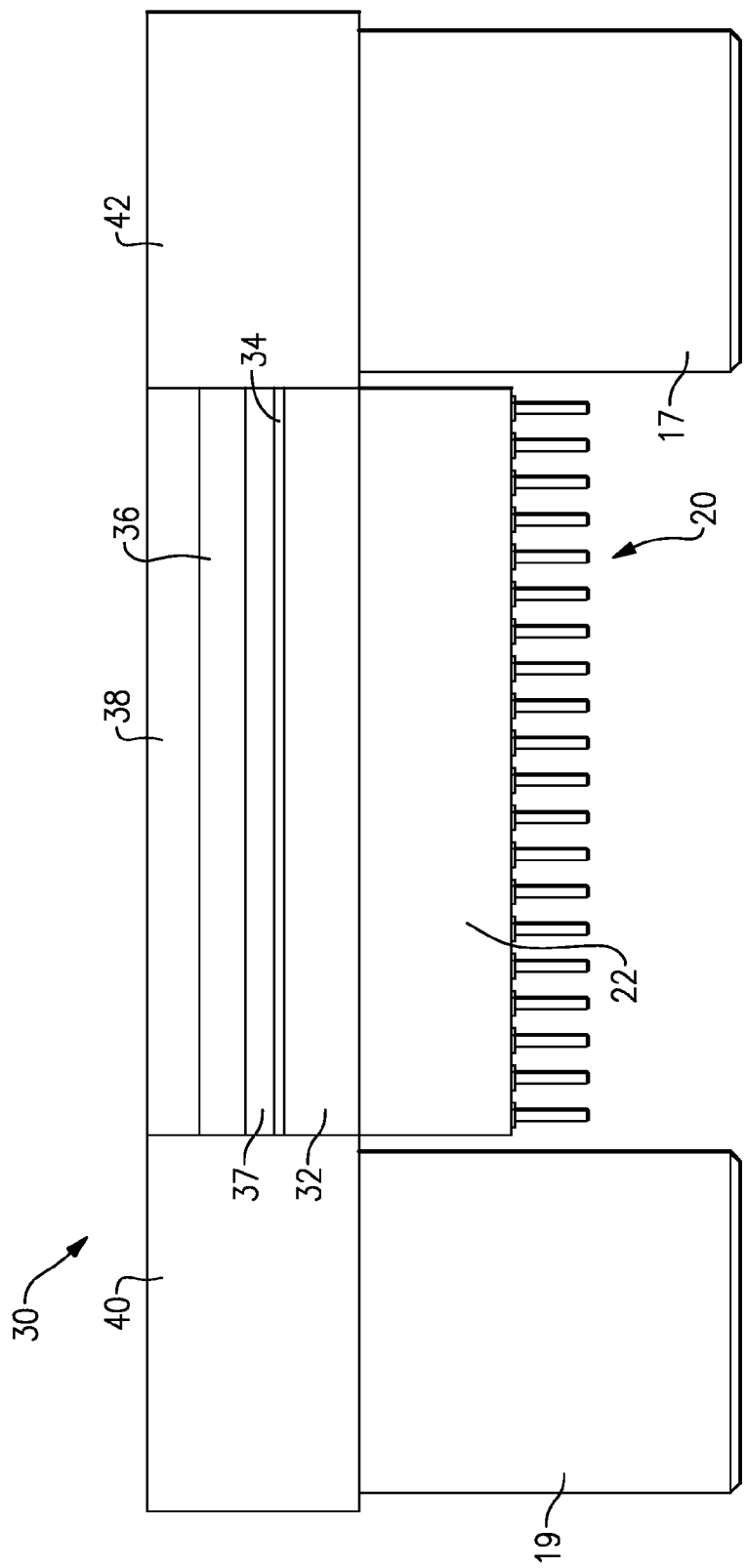
FIG. 2 shows a cooling supply and electronic component combination.

FIG. 2 shows a cooling fluid assembly or package 30 for the electronic component 22.

The package 30 incorporates a supply port 17, a supply plenum 42, a return port 19 and a return plenum 40. As shown, the electronic component 22 is in contact with an impingement channel layer 32. An orifice layer 34 is spaced further away from the assembly 20, and a slot layer 37 is spaced outwardly of the orifice layer 34. Headers 36 and 38 each serve one of the plenums 40 and 42.

In embodiments, as mentioned, the electronic component 22, which is part of the assembly 20 may be on the order of one millimeter by one millimeter. The total package 30 for such a component may extend for a left to right hand distance (as shown in FIG. 2) on the order of two millimeters. A thickness measured perpendicular to a face of the assembly 20 of the impingement channel layer 32 may be 0.1 millimeter, a thickness of the orifice layer 34 may be 0.015 millimeter, a thickness of the slot layer 37 may be 0.035 millimeter, a thickness of the header layer 36 may be 0.065 millimeter, and a thickness of the header layer 38 may be 0.070 millimeter. In general, the layers have thicknesses that are all preferably less than 0.15 millimeter, and the thicknesses of the orifice layer 34 and slot layer 37 are less than 0.05 millimeter.

As can be appreciated, the several layers 32, 34, 37, 36, and 38 provide a very compact overall package 30. As will be explained below, the layers deliver fluid to cool the electronic component 22 in an efficient and reliable manner.

Figure 3:
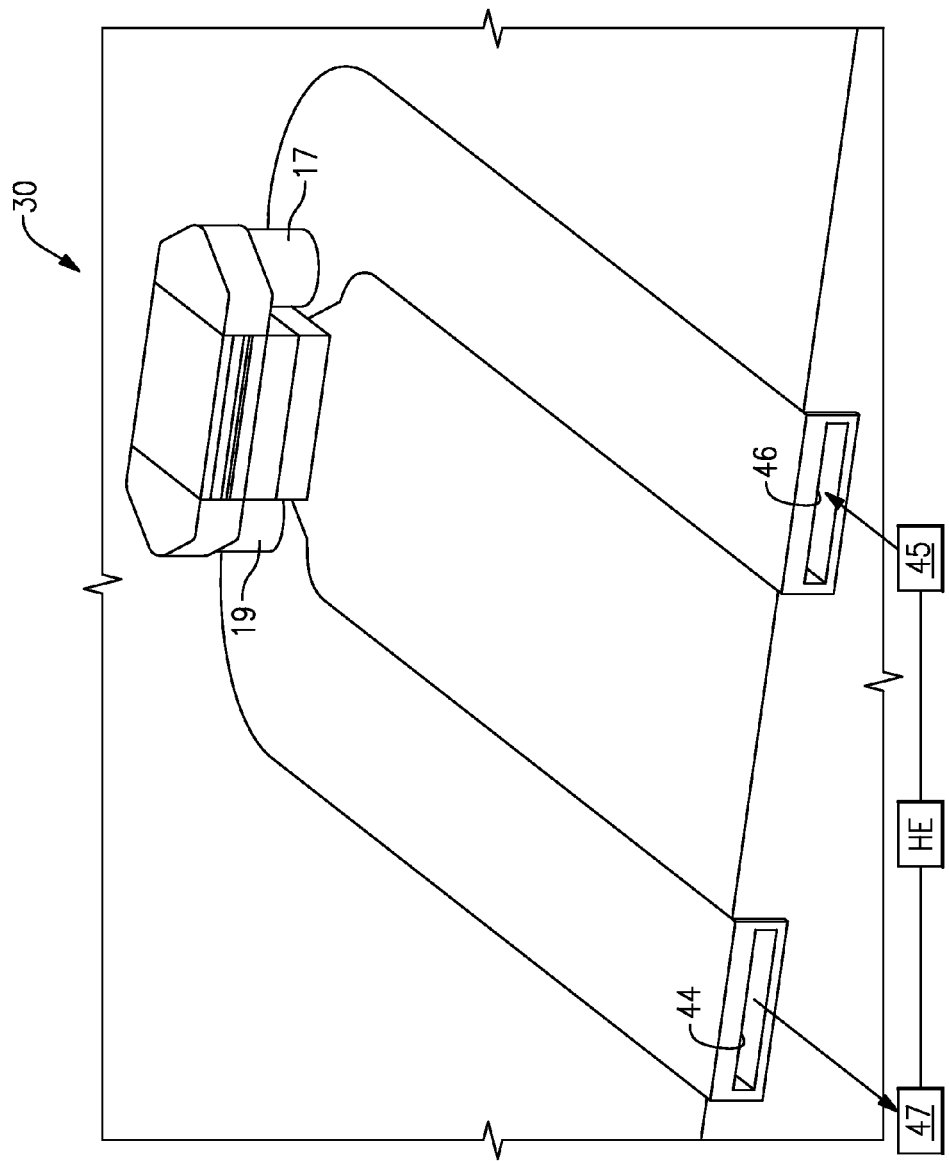
FIG. 3 shows further details of the combination.

FIG. 3 shows the package 30, with the supply tube 17 communicating with a supply channel 46. A source of cooling fluid 45 communicates into the channel 46. Similarly, the return tube 19 communicates with a channel 44 that delivers the fluid back to a downstream destination 47, which may communicate with a heat exchanger HE.

That is, the cooling fluid may pass through a closed circuit between the downstream destination 47 and supply 45, with an intermediate heat exchanger HE. A size of the channels 44 and 46 may be on the order of 0.15 millimeter by 1.0 millimeter.

Figure 4:
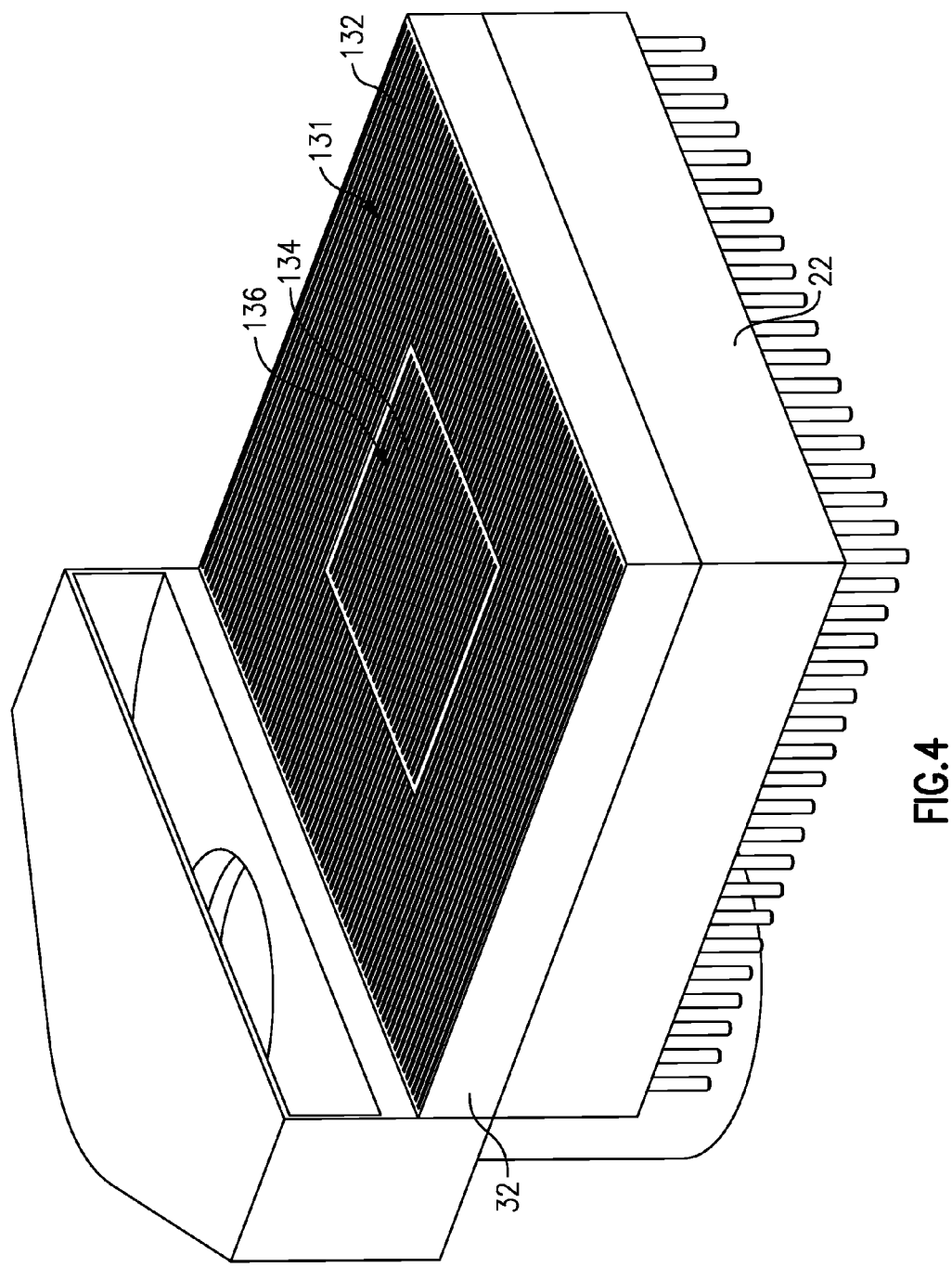
FIG. 4 shows a first layer in a cooling package.

FIG. 4 shows the impingement channel layer 32. The impingement channel layer has a zone 131 with channels 132. A zone 136 has channels 134. The density of channels 134 in zone 136 is higher than the density of channels 132 in zone 131. In general, the spacing between channels 134 is less than the spacing between channels 132.

As can be appreciated, the zone 136 corresponds to the higher heat generating area 26 while the zone 131 is positioned over the lower heat generating area 24. The channels 132 and 134 are shown to extend generally along an entire length of the electronic component 22. The channels 132 and 134 may have a width of approximately 0.0060 millimeter, and a height of 0.050 millimeter. More generally, the width of the channels 132 and 134 is less than 0.010 millimeter.

Figure 5:
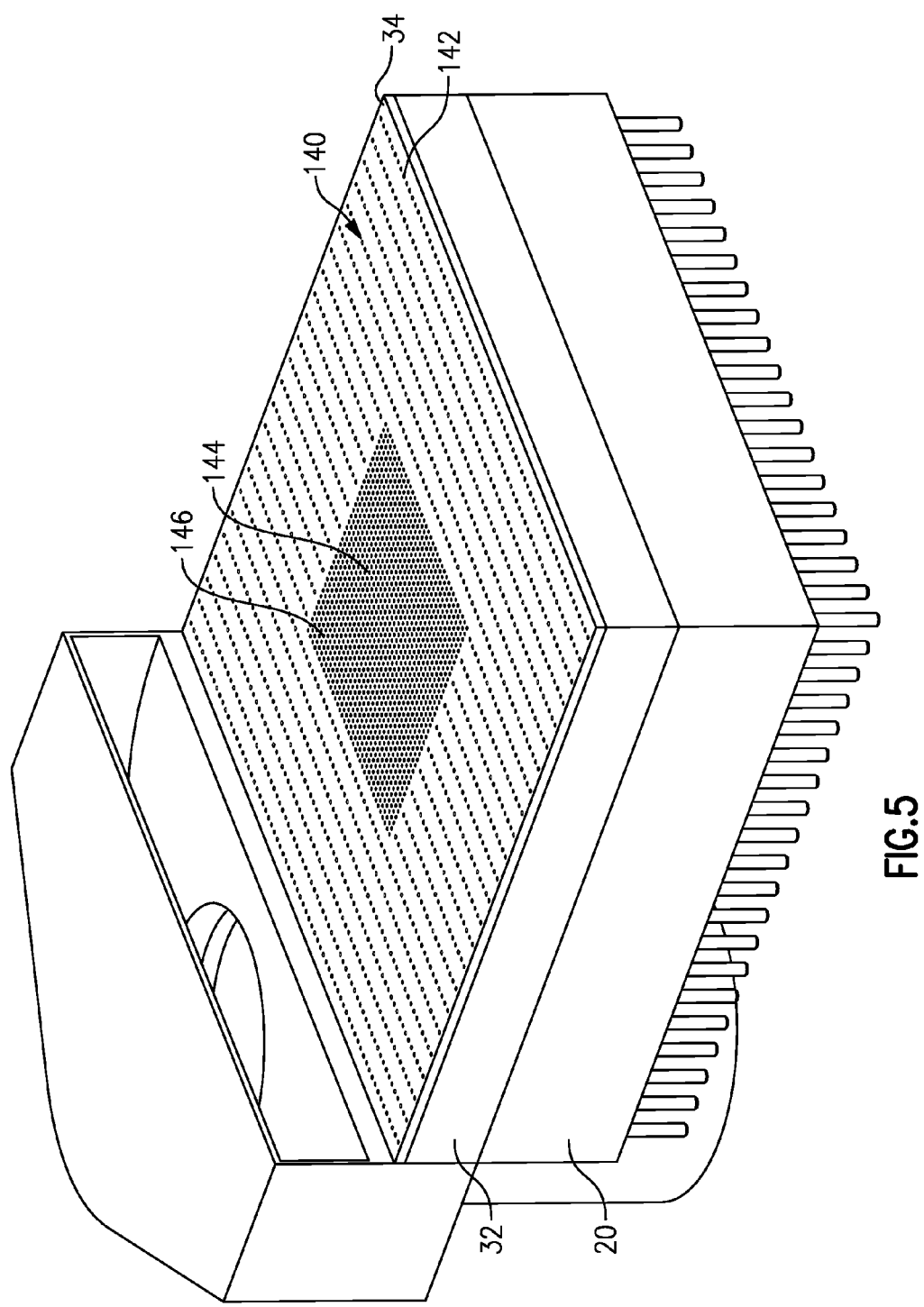
FIG. 5 shows a subsequent layer.

FIG. 5 shows an orifice layer 34. An area 140 has holes or orifices 142, while an area 144 has holes or orifices 146. As can be appreciated from FIG. 5, the density of holes 146 in area 144 is much greater than the density of holes 142 in area 140. By "high" and "low" density, and is apparent from the Figure, there are a greater number of holes for the higher density area than are found in the lower density area. Again, this corresponds to the zones 24 and 26 on the electronic component 22. The orifices 142 and 146 may have a hydraulic diameter of 0.0055 millimeter. In general, the hydraulic diameter of the orifices is less than or equal to 0.10 millimeter.

Figure 6:
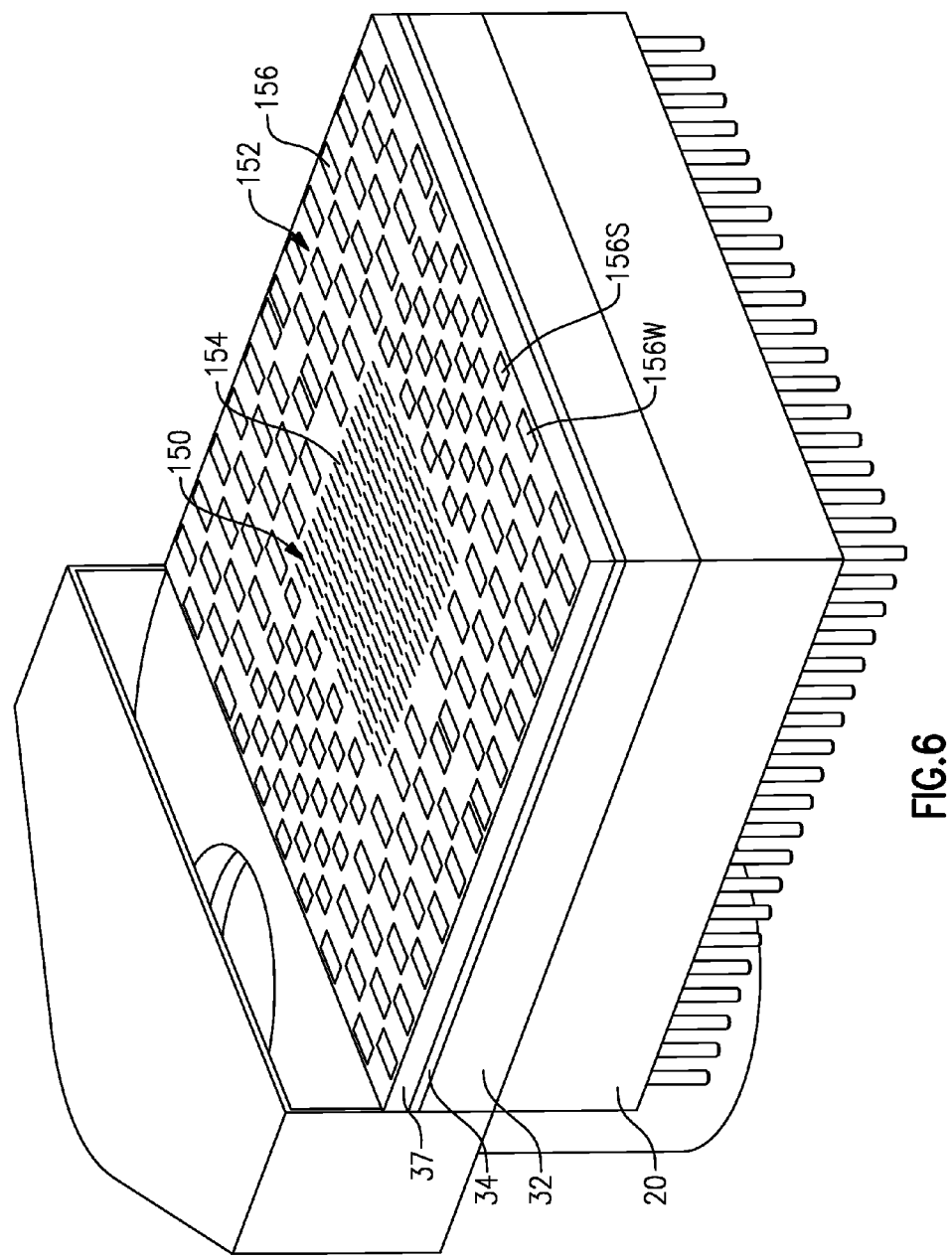
FIG. 6 shows another subsequent layer.

A top, or outer face, of a slot layer 37 is illustrated in FIG. 6. The slot layer 37 has a plurality of slots 156 in an area 152 and a plurality of slots 154 in an area 150. The density of slots 154 in area 150 is greater than the density of slots 156 in area 152. By "high" and "low" density, and is apparent from the Figure, there are a greater number of holes for the higher density area than are found in the lower density area. Again, the area 150 corresponds to the high heat zone area 26 on the chip 22.

As shown in FIG. 6, within area 152, there are actually wider slots 156W, and shorter slots 156S. The slots 156S are typically aligned with flow that would include the higher density slots 154. Thus, the volume of fluid supplied to cool or be returned from the higher heat generating area on the electronic component 22, results in a smaller volume through the smaller slots 156S.

Figure 7:
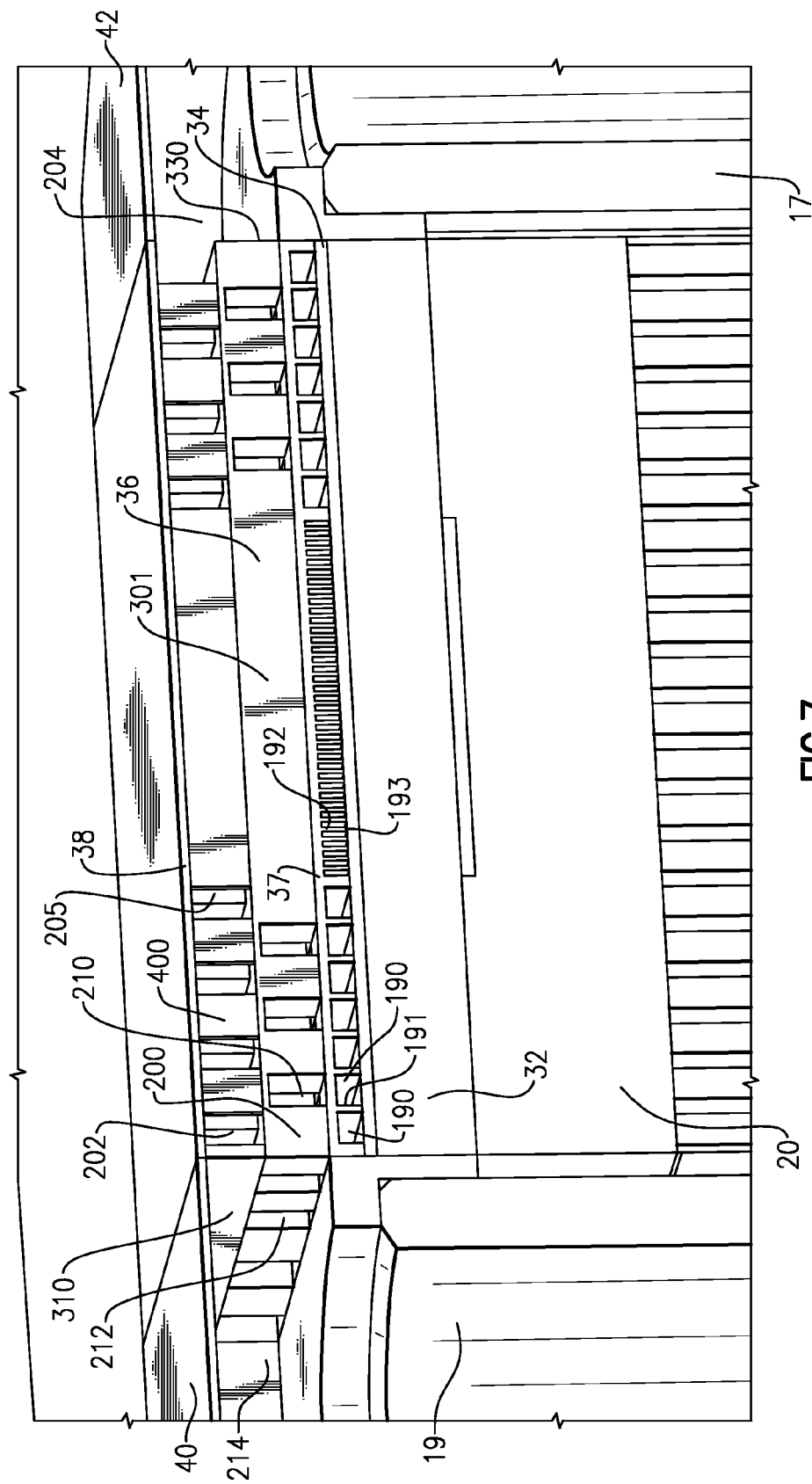
FIG. 7 shows further layers.

FIG. 7 shows further details of the slot layer 37. The channels in layer 32 and orifices in layer 34 are omitted here. Channels 190 extend between ribs 191. Similarly, channels 192 extend between ribs 193. The effect of the ribs 191, 193 is to break the flow between the orifice layer 34 and the slot layer 37 into separate flows. One set of channels 190 communicates with columns 200 in a supply header 36 while an adjacent channel 190 communicates through slots 156 to an area 210 between columns 200. As can be seen, columns 200 and area 210 are formed within a return header 36.

As can be appreciated from FIG. 7, columns 301 associated with the higher density range extend along an entire length of the higher density range. Spaced into the plane of this paper would be a similar elongated portion of an upper supply header 38.

Channels 212 between the columns 200 communicate with an area 214 and then the return port 19. Area 214 is the interior of the plenum 40.

A wall 310 of the supply header 38 blocks flow from its spaces 202 and its channels 205 from reaching area 214.

Similarly, a wall 330 on the return header 36 blocks flow from the areas 210 and channels 212 from reaching an area 204 and communicating with the supply port 17. Area 204 is the interior of plenum 42.

Figure 8:
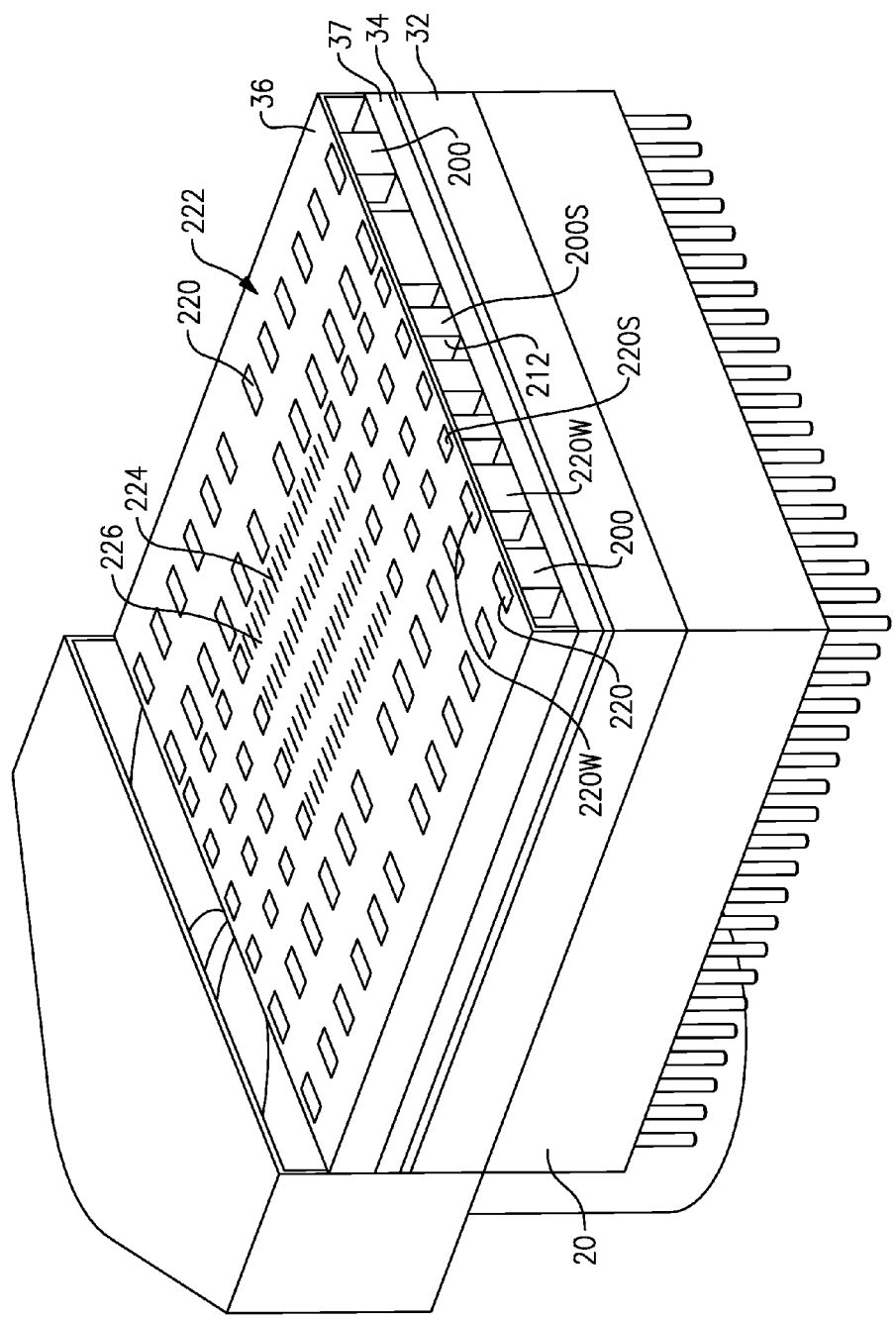
FIG. 8 shows a detail of the FIG. 7 layer.

FIG. 8 shows detail of a top surface of the return header 36. There are openings or slots 220 over the columns 200 in a low density area 222. There are closed areas over the channels 212 between the columns 200. As shown, there is a higher density of slots or openings 224 over the central area 226, which will in turn relate back to all of the other high density areas, and eventually back to the high heat flux area 26. By "high" and "low" density, and is apparent from the Figure, there are a greater number of holes for the higher density area than are found in the lower density area.

Here again, there are wider slots 220W, and wider columns 200W, and shorter or smaller slots 220S and smaller columns 200S, again associated with area 222. The smaller slots and columns 220S and 200S will be in flow communication with the area 226, which will receive a higher percentage of the flow. Use of the columns 200 evenly distributes fluid across the entire surface of the orifice plate and at a uniform pressure. The columns 200 also provide structural support, so that the layers of silicon are not separated due to the pressure being distributed across an entire unsupported area.

Figure 9A:
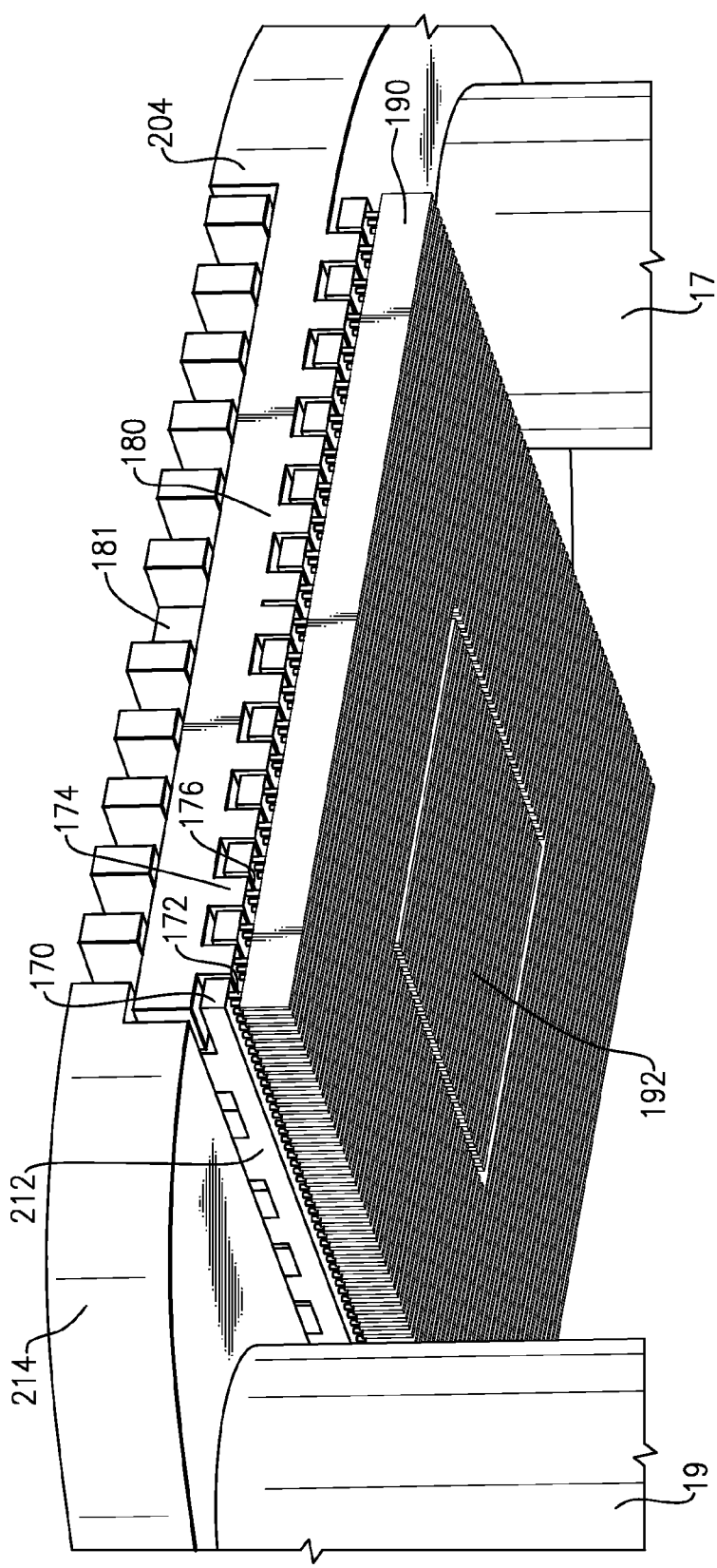
FIG. 9A shows the shape of the actual flow passages for delivering cooling fluid.

FIG. 9A is a reverse model of the layers 36, 37 and 38. FIG. 9A is actually illustrating the flow passages and not the structure. As can be appreciated, there are channels 190 and 192, which are found in the slot layer 37. Further, the supply channel spaces 180 can be seen communicating with the area 204, and then the supply port 17. The return port 19 communicates with the area 214 and the channels 212. Passages 174 are formed within the columns 200. Passages 181 are formed between the columns 400 in the upper header 30.

Figure 9B:
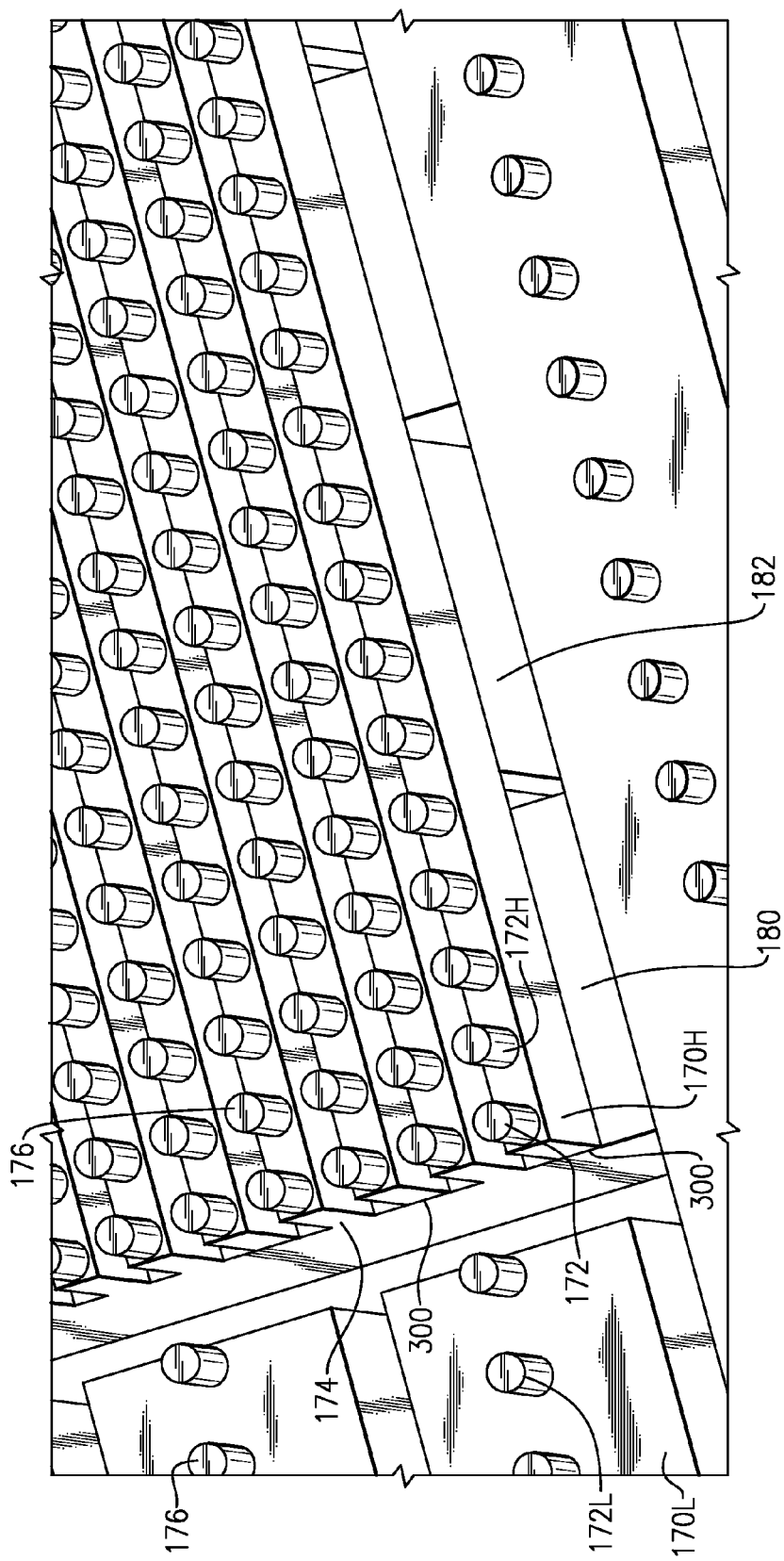
FIG. 9B shows a detail of FIG. 9A.

FIG. 9B is also a reverse model of the layers 34, 37 and 36. The holes or orifices form flow spaces 172. As shown, these are separated by a break 300 from other holes or spaces 176, to provide return and supply holes. Further, there are spaces 172H at the higher density area, and spaces 172L at the lower density area. The slot layer 37 provides slots 170H and 170L, respectively. Structure 182 corresponds to the columns, and spaces 180 correspond to the channels 210 in the layer 36.

Since FIGS. 9A and 9B are "reverse" of the structural FIGS. 1-8, it should be understood that breaks, such as shown at 300, between a channel 170 and the space 180 would actually be defined by structure. That is, there is a wall separating those flow passages in the actual package 30.

In embodiments, the total flow area of the return flow area 214 is greater than the total flow area of the supply flow area 204. In embodiments, the return header flow area was 0.60 millimeter$^2$ while the total flow area of the supply header was 0.35 millimeter$^2$. In embodiments, the total flow area of the return header is at least 1.5 the total flow area of the supply header.

It should be understood that the sizes disclosed throughout this application are to be seen as exemplary, and illustrate the extremely small size of the package which is provided to cool the electronics assembly 20. As can be appreciated, all of the flow passages and the structure disclosed to form the flow passages are extremely small. The structure may be layered utilizing known silicone etching techniques or other layering techniques appropriate for such small construction.

The complete supply of fluid to the surface of the electronic component 22 and the return will now be described. Fluid is supplied into channel 46 and through supply port 17 into the area 204. This fluid flows into channels 212 and through slots 154/156 on top of the slot layer 37. The slots 154/156 lead into channels 190/192 in the slot layer 37, then through orifices or holes 146 or 142 in the orifice layer 34, and into channels 132 or 134 in the impingement channel layer 32.

The fluid is then directed off surfaces on the electronic component 22. Since the holes or orifices 146 and 142 are small, the fluid impinges in a jet flow. The fluid flows along the channels 132 or 134 and then passes back through other holes 142 or 146 in the orifice layer 34 at locations aligned with slots 156 or 154 in the slot layer 37 that connect into columns 200.

This will, in turn, supply the fluid into channels 205 to pass into the area or plenum 214 and then the return port 19. From return port 19, the fluid returns to the channel 44 and the downstream location 47.

The present invention thus provides a way of providing uniform pressure fluid and a variation in the volume of fluid supplied to distinct areas on an electronic component.

In one embodiment, the cooling fluid utilized may be a Freon-based refrigerant such as FC3283. Of course, other fluids including liquid and gaseous fluids, may be utilized.

Although an embodiment of this invention has been disclosed, a worker of ordinary skill in this art would recognize that certain modifications would come within the scope of this disclosure. For that reason, the following claims should be studied to determine the true scope and content of this disclosure.

The invention claimed is:

1. A cooling package for an electronic component comprising:
    a supply port communicating with a plurality of outer supply channels, and a return port communicating with a plurality of outer return channels, said outer supply channels and said outer return channels communicating with distinct ones of openings in a slot layer and into return and supply slots, respectively;

an orifice layer for supplying fluid to an electronic component to be cooled from said supply slots and for receiving return fluid after having cooled the electronic component and returning the received fluid into said return slots, and there being a plurality of supply and return orifices in the orifice layer, with the supply orifices receiving a cooling fluid to be directed to the electronic component, and the return orifices receiving the return fluid after having cooled the electronic component, with said supply orifices not receiving the return fluid, and said return orifices not receiving the supply fluid; and said orifice layer is spaced from the electronic component to be cooled by an impingement channel layer, with the impingement channel layer having impingement channels communicating with said orifices in said orifice layer, such that fluid flows into the impingement channels from an orifice associated with a supply slot, flows along the impingement channels to cool the electronic component and then returns through others of said orifices in the orifice layer associated with said return slots; and wherein there is a first zone of higher density in said orifice layer, and a second zone of lesser density of said orifices in said orifice layer.

2. The package as set forth in claim 1, wherein said outer supply channels, said outer return channels, said return slots and said supply slots also have a first zone of higher density, and a second zone of lesser density.

3. The package as set forth in claim 2, wherein there are a greater number of holes in the higher density areas than are found in the lower density areas.

4. The package as set forth in claim 1, wherein said impingement channels are also provided with a first zone of higher density, and a second zone of lesser density.

5. The package as set forth in claim 1, wherein said outer return channels and said outer supply channels are formed within an outer header spaced on an opposed side of said slot layer from said orifice layer.

6. The package as set forth in claim 5, wherein said slot layer has slots on a surface facing away from the electronic component, with said slots communicating with one of said outer supply and outer return channels, and there being columns in said outer header communicating with others of said slots on said surface of said slot layer, with said columns communicating the fluid through a portion of the outer header into the other of said supply and return channels.

7. The package as set forth in claim 6, wherein said outer header is formed of two layers.

8. The package as set forth in claim 1, wherein said supply port communicating with the outer supply channels to receive a source of cooling fluid and said return port communicating with said outer return channels which communicates fluid to a downstream destination.

9. The package as set forth in claim 1, wherein a hydraulic diameter of orifices in said orifice layer being less than or equal to 0.10 millimeter.

10. A cooling supply and electronic component combination comprising:

an electronic component having a face in contact with a cooling fluid package; the cooling fluid package including a supply port communicating with a plurality of outer supply channels, and a return port communicating with a plurality of outer return channels, said outer supply channels and said outer return channels communicating with distinct ones of openings in a slot layer, and said slot layer having columns separating channels within said slot layer into slot return and supply channels;

an orifice layer for supplying fluid to said electronic component and for receiving return fluid after having cooled the electronic component, and there being a plurality of supply and return orifices in the orifice layer, with the supply orifices receiving a cooling fluid to be directed to the electronic component, and the return orifices receiving a cooling fluid to be directed to the electronic component, and the return orifices receiving the return fluid after having cooled the electronic component, with said supply orifices not receiving the return fluid, and said return orifices not receiving the supply fluid; and said orifice layer is spaced from the electronic component by an impingement channel layer, with the impingement channel layer having impingement channels communicating with said orifices in said orifice layer, such that fluid flows into the impingement channels from an orifice associated with a supply slot, flows along the impingement channels cooling the electronic component and then returns through others of said orifices in the orifice layer associated with said return slots; and wherein there is a first zone of higher density in said orifice layer, and a second zone of lesser density of said orifices in said orifice layer.

11. The combination as set forth in claim 10, wherein there is the first zone of higher density of said orifices in said orifice layer, and the second zone of lesser density of said orifices in said orifice layer, with said first zone associated with a higher heat generating area of said electronic component, and said second zone being associated with a lesser heat generating area on said electronic component.

12. The combination as set forth in claim 11, wherein said outer supply channels, said outer return channels, said return slots and said supply slots also have a zone of higher density, and a second zone of lesser density.

13. The combination as set forth in claim 12, wherein there are a greater number of holes in the higher density areas than are found in the lower density areas.

14. The combination as set forth in claim 11, wherein said impingement channels are also provided with a first zone of higher density, and a second zone of lesser density.

15. The combination as set forth in claim 10, wherein said outer return channels and said outer supply channels are formed within an outer header spaced on an opposed side of said slot layer from said orifice layer.

16. The combination as set forth in claim 15, wherein said slot layer has slots on a surface facing away from the electronic component to be cooled, with said slots communicating with one of said outer supply and outer return channels, and there being columns in said outer header communicating with others of said slots on said surface of said slot layer, with said columns communicating the fluid through a portion of the outer header into the other of said supply and return channels.

17. The combination as set forth in claim 16, wherein said outer header is formed of two layers.

18. The combination as set forth in claim 10, wherein said supply port communicating with the outer supply channels to receive a source of cooling fluid and said return port communicating with said outer return channels which communicates fluid to a downstream destination.

19. The combination as set forth in claim 10, wherein a hydraulic diameter of orifices in said orifice layer being less than or equal to 0.10 millimeter.

* * * * *